(12) United States Patent
Sueno (10) Patent No.: US 10,383,270 B2
(45) Date of Patent: Aug. 13, 2019

(54) COMPONENT CRIMPING DEVICE AND COMPONENT CRIMPING METHOD

(71) Applicant: Panasonic Intellectual Property Management Co., Ltd., Osaka (JP)

(72) Inventor: Shigeru Sueno, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 358 days.

(21) Appl. No.: 15/480,435

(22) Filed: Apr. 6, 2017

(65) Prior Publication Data

US 2017/0311492 A1 Oct. 26, 2017

(30) Foreign Application Priority Data

Apr. 21, 2016 (JP) ................. 2016-084871

(51) Int. Cl.
*H05K 13/04* (2006.01)
*H01R 4/18* (2006.01)
(Continued)

(52) U.S. Cl.
CPC ......... *H05K 13/046* (2013.01); *G02F 1/1303* (2013.01); *H01R 4/18* (2013.01);
(Continued)

(58) Field of Classification Search
CPC .... H05K 3/301; H05K 3/323; H05K 13/0061; H05K 13/0069; H05K 13/0404; H05K 13/0408; H05K 13/0409; H05K 13/046; H05K 2201/10136; H01R 4/18; H01R 43/04; H01R 43/048; H01R 43/0486; H01R 43/0488; H01R 43/058; Y10T 29/4913; Y10T 29/53174; Y10T 29/53178;
(Continued)

(56) References Cited

U.S. PATENT DOCUMENTS 7,075,036 B2 * 7/2006 Ogimoto .............. B23K 20/023
219/243
7,797,822 B2 * 9/2010 Sakai ...................... H01L 24/83
29/832

(Continued)

FOREIGN PATENT DOCUMENTS

JP 2003-347359 A 12/2003
JP 3997838 B2 10/2007
WO 2006/054637 A1 5/2006

*Primary Examiner* — Peter Dungba Vo
*Assistant Examiner* — Joshua D Anderson
(74) *Attorney, Agent, or Firm* — Pearne & Gordon LLP (57) ABSTRACT

An object of the present disclosure is to provide a component crimping device and a component crimping method that make it possible to improve accuracy of attaching a component onto a substrate by preventing the component from being excessively elongated due to rapid thermal expansion when the component is pressed against the substrate. A lower surface side of a substrate-side terminal part of a substrate held by a substrate holding table is supported by a support, a component placed on a placing table is picked up by a crimping head while heating the component, the component is compressed against a compressing table so as to be elongated, and then the component is pressed against the substrate-side terminal part.

10 Claims, 10 Drawing Sheets (51) Int. Cl.
  *H01R 43/048* (2006.01)
  *H05K 13/00* (2006.01)
  *G02F 1/13* (2006.01)
  *H05K 3/32* (2006.01)
  *H05K 3/36* (2006.01)

(52) U.S. Cl.
  CPC ........... *H01R 43/048* (2013.01); *H05K 3/323* (2013.01); *H05K 3/361* (2013.01); *H05K 13/0061* (2013.01); *H05K 13/0404* (2013.01); *H05K 2201/10136* (2013.01); *H05K 2203/0278* (2013.01); *Y10T 29/53174* (2015.01); *Y10T 29/53191* (2015.01)

(58) Field of Classification Search
  CPC ......... Y10T 29/53183; Y10T 29/53187; Y10T 29/53191; Y10T 29/5327
  See application file for complete search history.

(56) References Cited

U.S. PATENT DOCUMENTS

| | | | |
|---|---|---|---|
| 7,980,444 B2 * | 7/2011 | Ebihara | H01L 24/75 228/1.1 |
| 2009/0133915 A1 | 5/2009 | Higashitani | |

\* cited by examiner

COMPONENT CRIMPING DEVICE AND COMPONENT CRIMPING METHOD

BACKGROUND

1. Technical Field

The present disclosure relates to a component crimping device and a component crimping method for picking up a component while heating the component and then crimping the component thus picked up onto a terminal part of a substrate by pressure.

2. Description of the Related Art

A conventional component crimping device used, for example, for manufacturing of a liquid crystal panel crimps, by pressure, a component picked up by a crimping head onto a terminal part of a substrate held by a substrate holding table while supporting a lower surface side of the terminal part of the substrate by using a support. A thermosetting resin tape called an anisotropic conductive film (ACF) is attached to the terminal part of the substrate, and this resin tape is thermally cured by application of heat when the component is pressed against the terminal part. For this reason, the crimping head is provided with a heater, and the crimping head heated by the heater heats the resin tape through the component (Patent Literature 1 (PTL 1) below).

CITATION LIST

Patent Literature

PTL 1: Unexamined Japanese Patent Publication No. 2003-347359

SUMMARY

However, in a case where the component crimped onto the substrate is, for example, a film-shaped component having a large thermal expansion coefficient (e.g., a flexible substrate), the component pressed against the substrate by the heated crimping head is elongated due to rapid thermal expansion. Such elongation is negligible in a case where the component has a small size. However, in a case where the component has a large size, the amount of elongation becomes excessive. This leads to a risk of decrease in accuracy of attachment to the substrate.

In view of this, an object of the present disclosure is to provide a component crimping device and a component crimping method that make it possible to improve accuracy of attaching a component onto a substrate while preventing the component pressed against the substrate from being excessively elongated due to rapid thermal expansion.

A component crimping device according to the present disclosure includes a substrate holding table, a support, a component placing part, a crimping head, a component compressing part, and a controller that controls operation of the crimping head such that the crimping head picks up a component, compresses the component against the component compressing part so as to elongate the component, and then presses the component against a terminal part. The substrate holding table holds a substrate. The support supports a lower surface side of a terminal part of the substrate held by the substrate holding table. The component placing part is a part on which the component to be crimped onto the terminal part is placed. The crimping head picks up the component placed on the component placing part while heating the component. The component compressing part is a part against which the component is compressed. The controller controls operation of the crimping head such that the crimping head picks up a component, compresses the component against the component compressing part so as to elongate the component, and then presses the component against the terminal part.

A component crimping method according to the present disclosure includes a substrate holding step, a support step, a pickup step, a component compressing step, and a pressing step. In the substrate holding step, a substrate is held by a substrate holding table. In the support step, a lower surface side of a terminal part of the substrate held by the substrate holding table is supported by a support. In the pickup step, a crimping head picks up a component placed on a component placing part while heating the component. In the component compressing step, the crimping head compresses the picked-up component against a component compressing part so as to elongate the component. In the pressing step, the component elongated by being compressed against the component compressing part is pressed against the terminal part by the crimping head.

According to the present disclosure, it is possible to improve accuracy of attaching a component onto a substrate by preventing the component from being excessively elongated due to rapid thermal expansion when the component is pressed against the substrate.

DETAILED DESCRIPTION OF EMBODIMENTS

Figure 1:
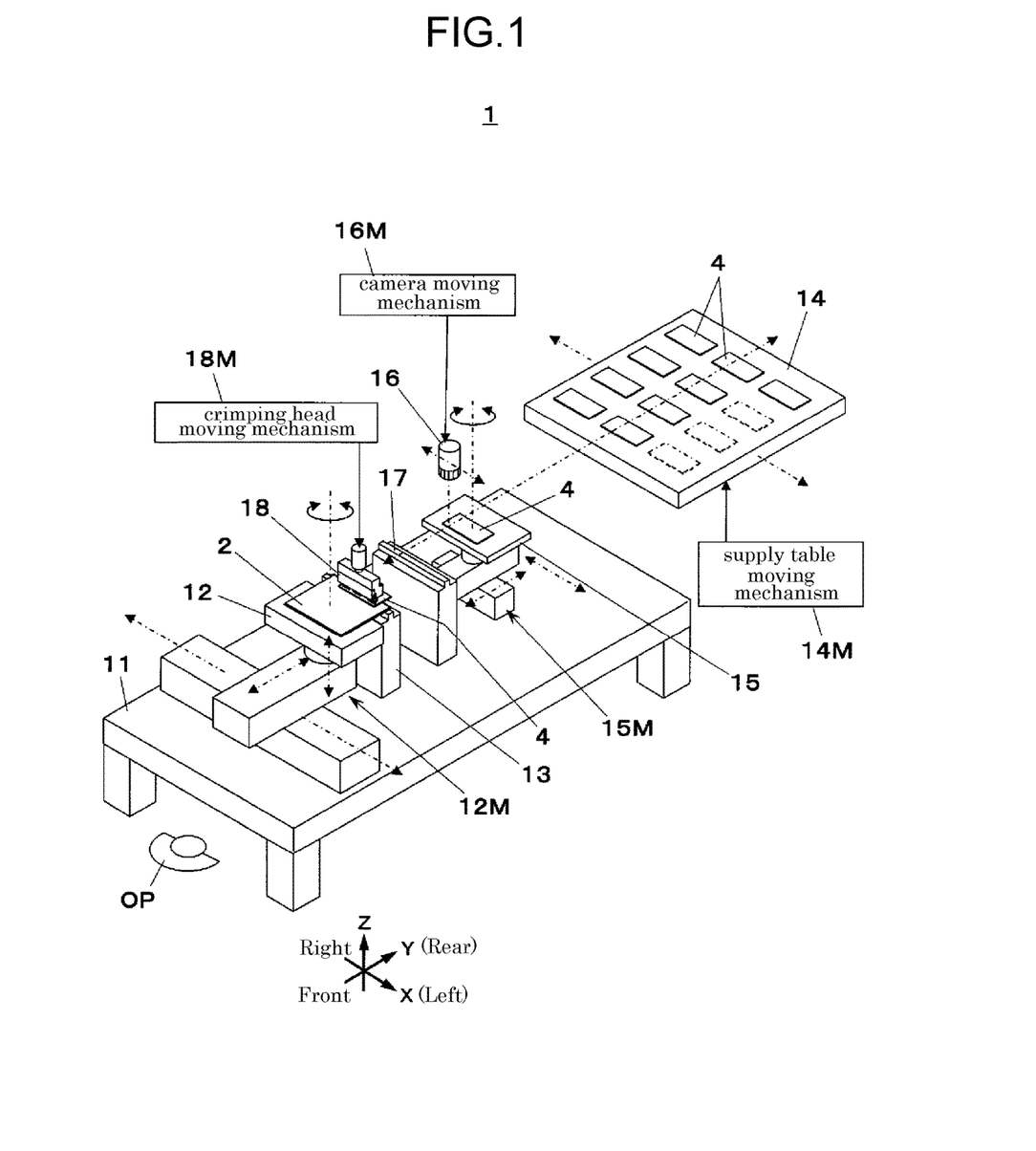
FIG. 1 is a perspective view of a component crimping device according to an exemplary embodiment of the present disclosure.
Figure 2:
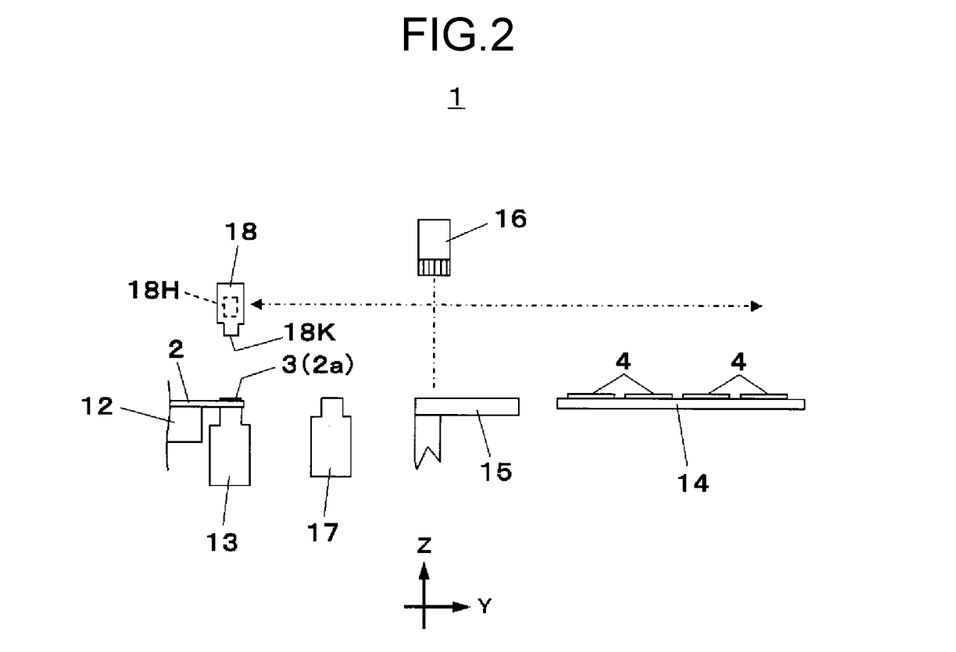
FIG. 2 is a side view of the component crimping device according to the exemplary embodiment of the present disclosure.
Figure 3:
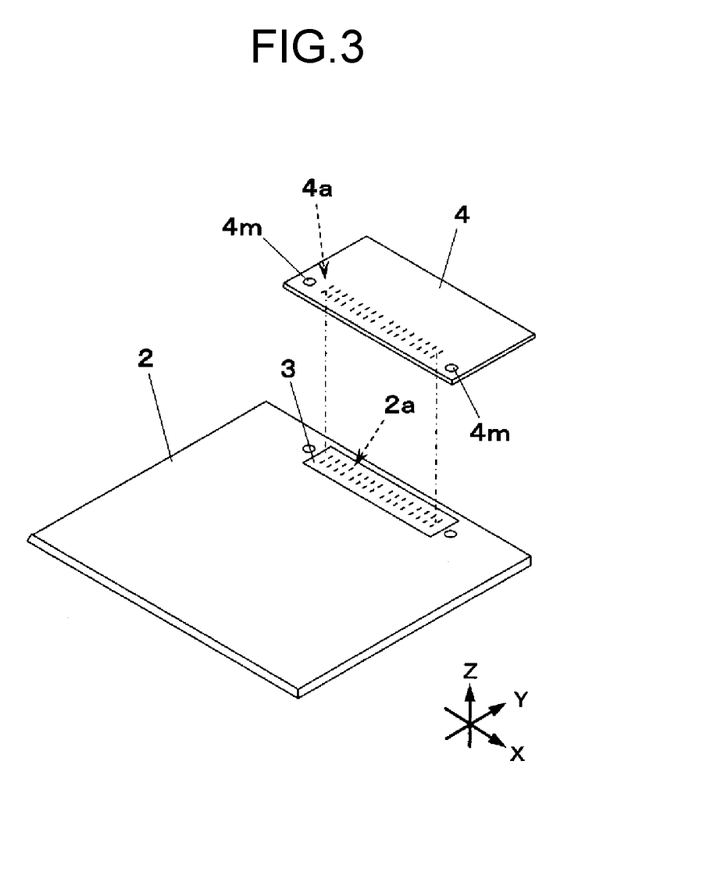
FIG. 3 is a perspective view illustrating a substrate and a component to be crimped onto the substrate by the component crimping device according to the exemplary embodiment of the present disclosure.

An exemplary embodiment of the present disclosure is described below with reference to the drawings. Component crimping device 1 illustrated in FIGS. 1 and 2 is a device that constitutes part of a liquid crystal panel substrate manufacturing line. Component crimping device 1 is a device that crimps (temporarily crimps) film-shaped component 4 onto a terminal part (substrate-side terminal part 2a) provided on an upper surface of an end along one of four sides of rectangular panel-shaped substrate 2 illustrated in FIG. 3 such that thermosetting resin tape 3 such as an ACF attached over substrate-side terminal part 2a is interposed between film-shaped component 4 and terminal part. "Film-shaped component 4" as used herein refers to a film-shaped component such as a flexible substrate and has, on a lower surface side, a terminal part (component-side terminal part 4a) to be joined to substrate-side terminal part 2a. In the following description, it is assumed that a left-right direction viewed from operator OP is an X-axis direction. Furthermore, it is assumed that a front-rear direction viewed from operator OP is a Y-axis direction and that a top-bottom direction viewed from operator OP is a Z-axis direction.

In FIGS. 1 and 2, component crimping device 1 includes substrate holding table 12, support 13, component supply table 14, placing table 15, camera 16, compressing table 17, and crimping head 18 that are provided on base 11.

In FIG. 1, substrate holding table 12 holds substrate 2, for example, by vacuum suction. Substrate 2 is placed on an upper surface of substrate holding table 12. Substrate holding table 12 is linked to substrate holding table moving mechanism 12M provided on base 11, and substrate holding table moving mechanism 12M moves substrate holding table 12 in the X-axis direction, Y-axis direction, and Z-axis direction, and about the Z-axis direction. Support 13 is provided behind substrate holding table 12. Support 13 has an upper surface that is elongated in the X-axis direction.

In FIG. 1, component supply table 14 holds a plurality of components 4 in a manner such that components 4 are lined up. Component supply table 14 is linked to supply table moving mechanism 14M, and supply table moving mechanism 14M moves component supply table 14 in the X direction.

In FIG. 1, placing table 15 is a component placing part on which component 4 to be crimped onto substrate-side terminal part 2a is placed. Component 4 supplied by component supply table 14 is temporarily placed (provisionally placed) on placing table 15. Placing table 15 is linked to placing table moving mechanism 15M provided between support 13 and component supply table 14. Placing table moving mechanism 15M moves placing table 15 in the X-axis direction and the Y-axis direction and about the Z-axis direction.

Figure 4A:
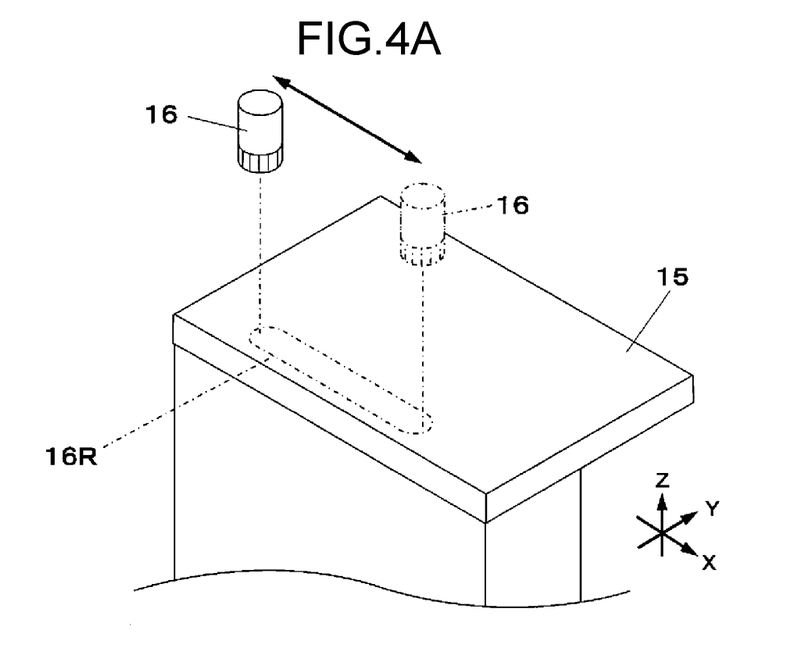
FIG. 4A is a perspective view illustrating a camera and a placing table of the component crimping device according to the exemplary embodiment of the present disclosure.
Figure 4B:
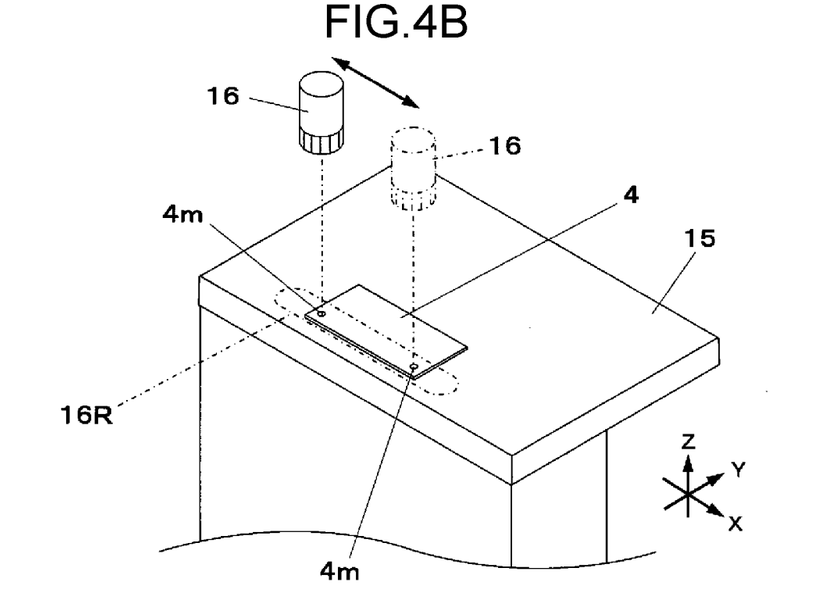
FIG. 4B is a perspective view illustrating the camera and the placing table of the component crimping device according to the exemplary embodiment of the present disclosure.

FIGS. 4A and 4B are perspective views illustrating placing table 15 of component crimping device 1 together with camera 16.

In FIG. 1, camera 16 is linked to camera moving mechanism 16M, and camera moving mechanism 16M moves camera 16 in the X-axis direction. Imaging field of camera 16 faces downward, and camera 16 captures an image of predetermined imaging region 16R while being moved in the X-axis direction by camera moving mechanism 16M (FIG. 4A). Accordingly, by placing component 4 on placing table 15 such that two component marks 4m are located within imaging region 16R of camera 16, images of two component marks 4m can be captured by camera 16 (FIG. 4B).

In FIG. 1, compressing table 17 is fixedly provided between placing table 15 and support 13 that are provided on base 11. Compressing table 17 has an upper surface elongated in the X-axis direction, and component 4 that has been heated is compressed against this upper surface and is thus elongated (described later).

In FIG. 2, crimping head 18 includes component suction part 18K that causes component 4 to be sucked onto a lower end of crimping head 18. Crimping head 18 is linked to crimping head moving mechanism 18M, and crimping head moving mechanism 18M moves crimping head 18 in the Y-axis direction and the Z-axis direction. Accordingly, crimping head 18 is movable between a region above placing table 15 and a region above support 13. Crimping head 18 includes heater 18H (FIG. 2). In a case where heater 18H is turned on, heater 18H generates heat. This heats crimping head 18. As a result, a temperature of crimping head 18 rises.

Figure 5:
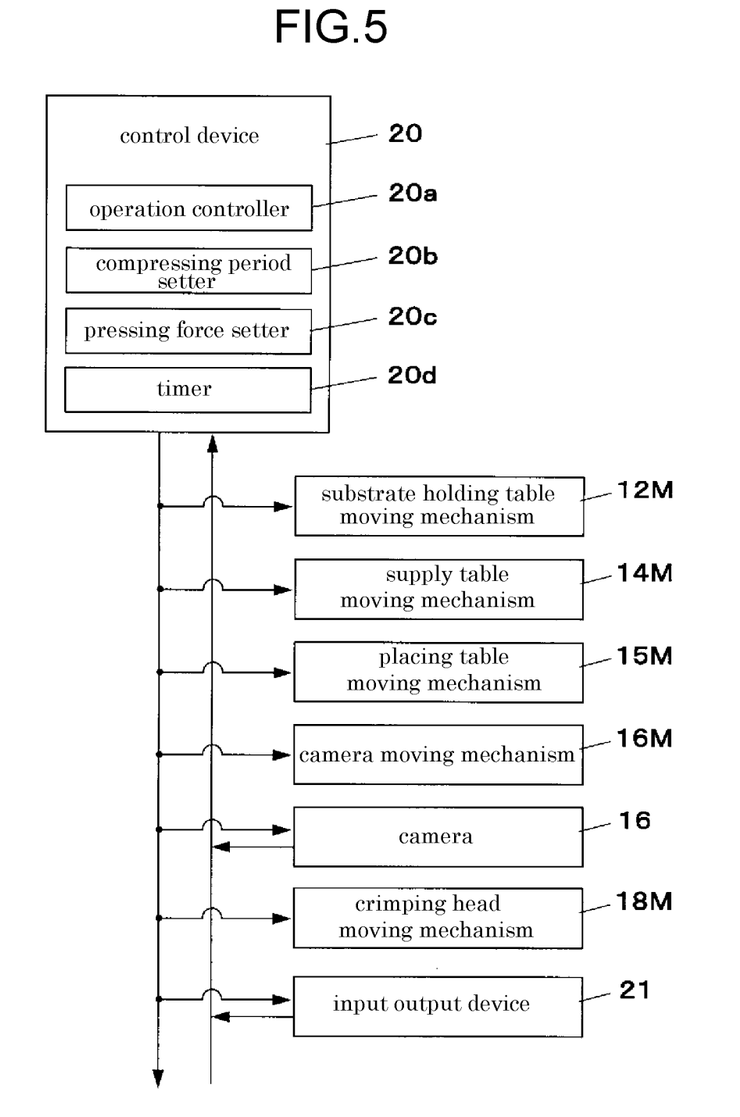
FIG. 5 is a block diagram illustrating a control system of the component crimping device according to the exemplary embodiment of the present disclosure.

In FIG. 5, operation controller 20a of control device 20 that is included in component crimping device 1 controls movement of substrate holding table 12 in the X-axis direction, Y-axis direction, and Z-axis direction, and about the Z-axis direction by substrate holding table moving mechanism 12M, movement of component supply table 14 in the X-axis direction by supply table moving mechanism 14M, and movement of placing table 15 in the X-axis direction and the Y-axis direction and about the Z-axis direction by placing table moving mechanism 15M. Furthermore, operation controller 20a of control device 20 controls movement of camera 16 in the X-axis direction by camera moving mechanism 16M and movement of crimping head 18 in the Y-axis direction and the Z-axis direction by crimping head moving mechanism 18M.

In FIG. 5, operation controller 20a of control device 20 controls capturing of camera 16, and image information obtained by capturing of camera 16 is sent to control device 20. Input output device 21 such as a touch panel is connected to control device 20, and operator OP can input necessary information into component crimping device 1 by using input output device 21. Furthermore, operator OP can obtain various kinds of information concerning component crimping device 1 by using input output device 21.

Figure 6A:
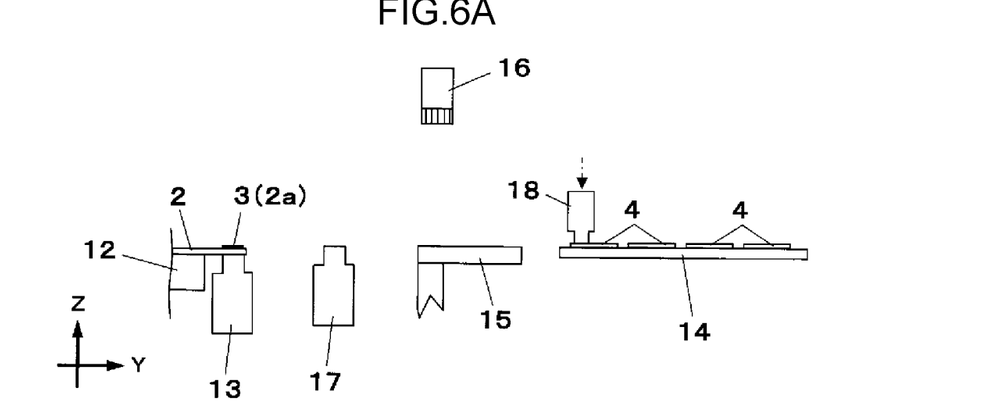
FIG. 6A is a diagram for explaining operation of the component crimping device according to the exemplary embodiment of the present disclosure.
Figure 6B:
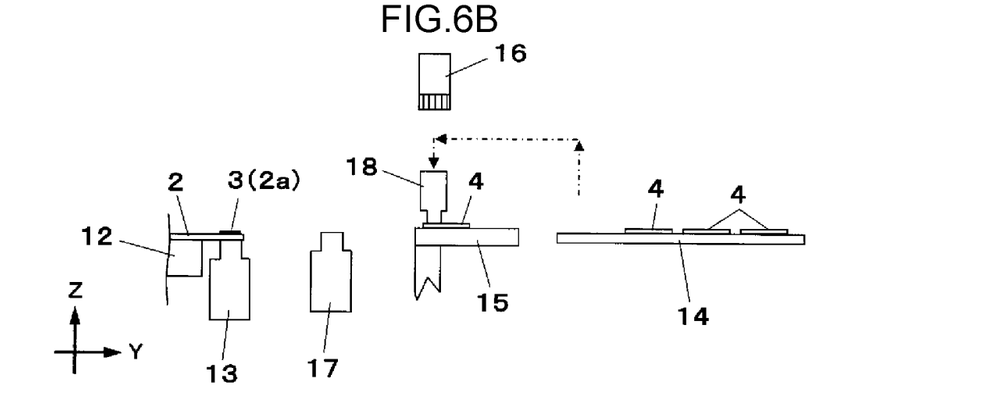
FIG. 6B is a diagram for explaining operation of the component crimping device according to the exemplary embodiment of the present disclosure.
Figure 6C:
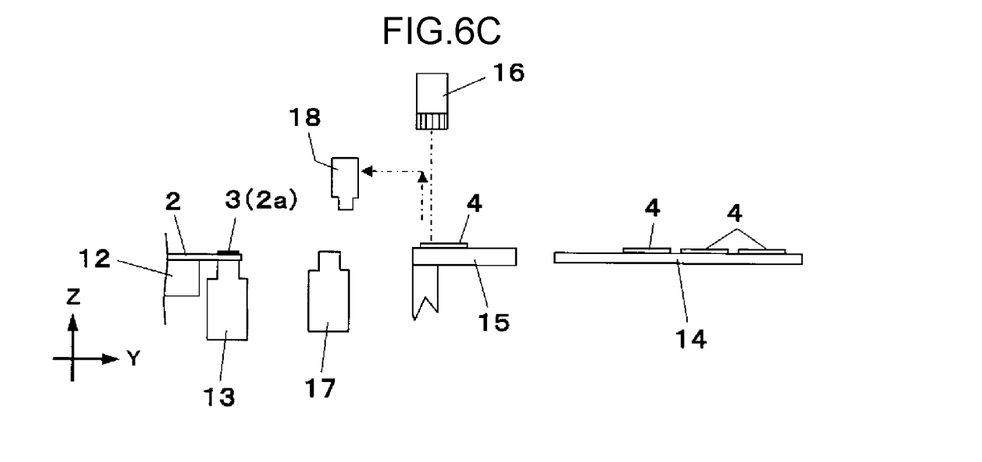
FIG. 6C is a diagram for explaining operation of the component crimping device according to the exemplary embodiment of the present disclosure.

FIGS. 6A through 6C are diagrams for explaining operation of component crimping device 1.

In a case where component 4 is crimped onto substrate 2 by component crimping device 1, first, externally supplied substrate 2 is held by substrate holding table 12 (substrate holding step). Then, posture of substrate 2 is adjusted such that substrate-side terminal part 2a (thermosetting resin tape 3) is located on a rear edge side of substrate 2 and such that a lower surface of substrate-side terminal part 2a is supported by support 13 (FIG. 6A; support step). Then, crimping head 18 moves to a region above component supply table 14 and then moves downward and picks up component 4 by suction (FIG. 6B).

Crimping head 18 having picked up component 4 moves to a region above placing table 15 and then moves downward and places component 4 onto placing table 15 (FIG. 6B). In this step, crimping head 18 places component 4 onto placing table 15 such that two component marks 4m of component 4 that are aligned in a longitudinal direction (X-axis direction) are at predetermined positions. The "predetermined positions" are positions where two component marks 4m of component 4 are located within imaging region 16R of camera 16.

Crimping head 18 having placed component 4 onto placing table 15 moves upward and then moves forward out of a region above placing table 15 (imaging region of camera 16) (FIG. 6C). After crimping head 18 moves out of the region above placing table 15, camera 16 captures an image of imaging region 16R while being moved in the X-axis direction by camera moving mechanism 16M and thus captures images of component marks 4m of component 4 from above (FIG. 6C). Camera 16 sends image information of two component marks 4m obtained by capturing to control device 20, and control device 20 grasps a position of component 4 on placing table 15 on the basis of the image information of two component marks 4m sent from camera 16.

Furthermore, control device 20 detects a size (a size in the longitudinal direction, i.e., the X-axis direction in this example) of component 4 on the basis of an interval between two component marks 4m (size detection step). Then, control device 20 causes compressing period setter 20b (FIG. 5) to set a compressing period in accordance with the size of component 4 (compressing period setting step) and causes pressing force setter 20c (FIG. 5) to set pressing force in accordance with the size of the component 4 (pressing force setting step).

In the step, camera 16 serves as a size detection unit that detects the size of component 4. Furthermore, compressing period setter 20b of control device 20 serves as a compressing period setting unit that sets a compressing period of component 4 in accordance with the size of component 4 (e.g., in accordance with the size of component 4 detected by the size detection unit). Furthermore, pressing force setter 20c of control device 20 serves as a pressing force setting unit that sets pressing force by which crimping head 18 presses component 4 against substrate 2 in accordance with the size of component 4 (e.g., in accordance with the size of component 4 detected by the size detection unit).

The compressing period set by the compressing period setter 20b is a period for which a state where component 4 picked up by crimping head 18 heated by heater 18H is compressed against compressing table 17 continues. The compressing period is set on the basis of a period in which component 4 heated by crimping head 18 is sufficiently elongated in the X-axis direction due to thermal expansion and is set longer as the size of component 4 becomes larger. Accordingly, in a case where components 4 have two sizes (a large size and a small size), a longer compressing period is set in the case of the large size than in the case of the small size. The compressing period set in accordance with the size of component 4 may be read out from prestored data of correspondences between sizes of component 4 and compressing periods or may be calculated each time (every time the size of component 4 is detected) by using a calculation formula.

The pressing force set by pressing force setter 20c is pressing force by which crimping head 18 presses component 4 against substrate 2. The pressing force is set on the basis of a period in which component 4 pressed against substrate 2 is firmly crimped onto substrate 2 and is set larger as the size of component 4 becomes larger. Accordingly, in a case where components 4 have two sizes (a large size and a small size), larger pressing force is set in the case of the large size than in the case of the small size. A correspondence between the size of component 4 and pressing force may be read out from prestored correspondence data or may be calculated each time (every time the size of component 4 is detected) by using a calculation formula.

Operation controller 20a of control device 20 having grasped the position of component 4 on placing table 15 corrects the position of component 4. The position of component 4 is corrected by moving placing table 15 within a horizontal plane by activating placing table moving mechanism 15M. This correction of the position of component 4 allows crimping head 18 to suck component 4 at an appropriate position, in a pickup step that will be described later.

Figure 7A:
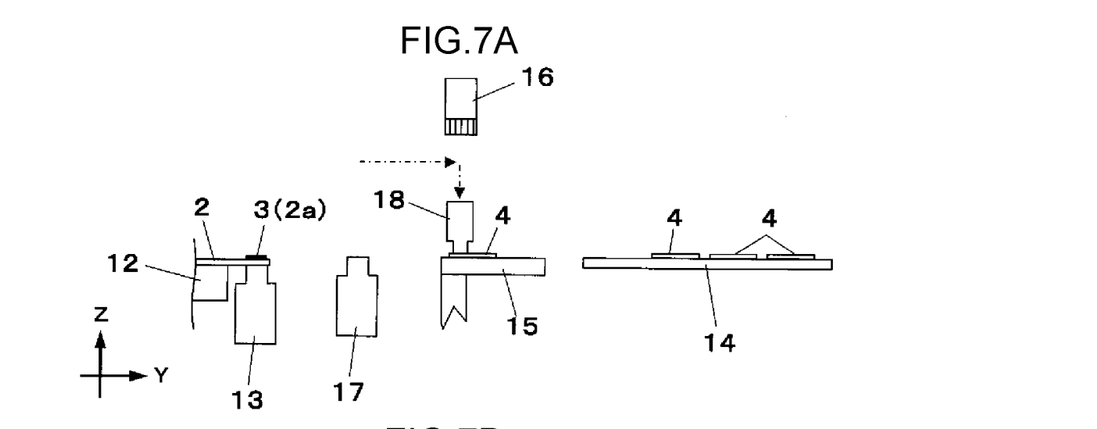
FIG. 7A is a diagram for explaining operation of the component crimping device according to the exemplary embodiment of the present disclosure.
Figure 7B:
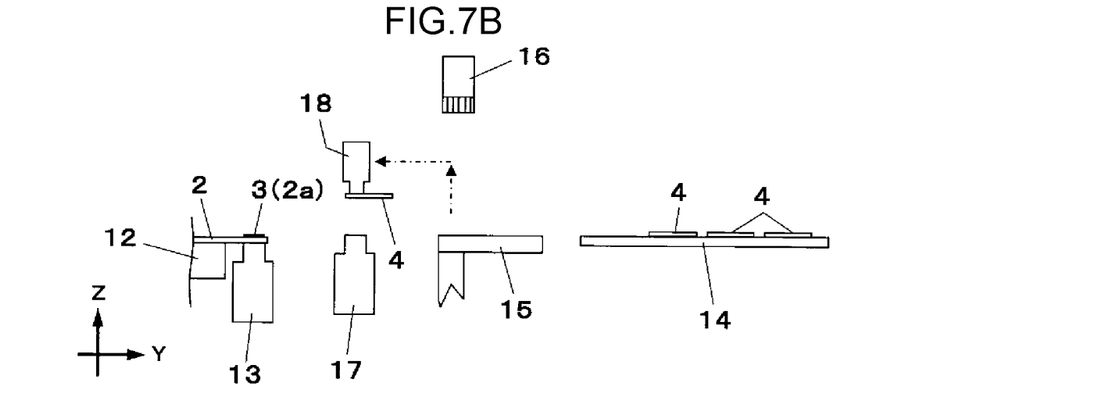
FIG. 7B is a diagram for explaining operation of the component crimping device according to the exemplary embodiment of the present disclosure.
Figure 7C:
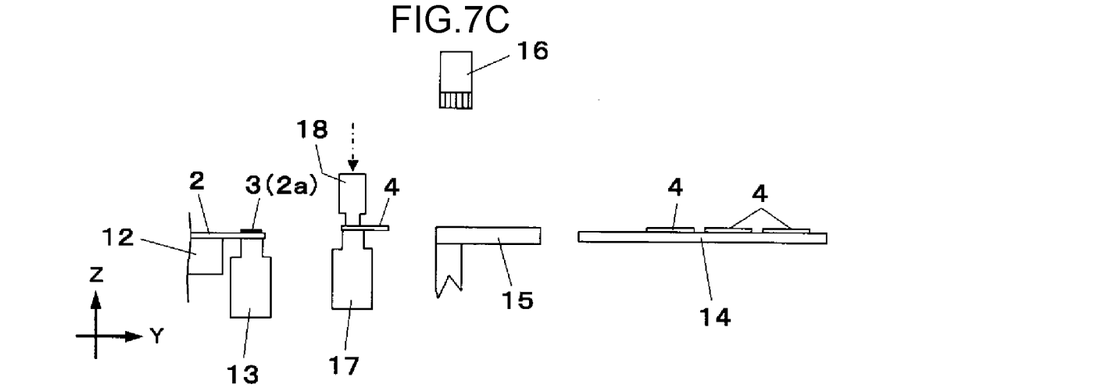
FIG. 7C is a diagram for explaining operation of the component crimping device according to the exemplary embodiment of the present disclosure.

FIGS. 7A through 7C are diagrams for explaining operation of component crimping device 1.

After correction of the position of component 4, crimping head 18 moves to a region above placing table 15 and then moves downward and picks up component 4 by suction (FIG. 7A; pickup step). In this pickup step, heater 18H provided in crimping head 18 is turned on by control device 20, and crimping head 18 picks up component 4 while heating component 4. This also heats component 4 sucked by crimping head 18. As a result, a temperature of component 4 rises, and component 4 thermally expands in an in-plane direction.

Figure 8:
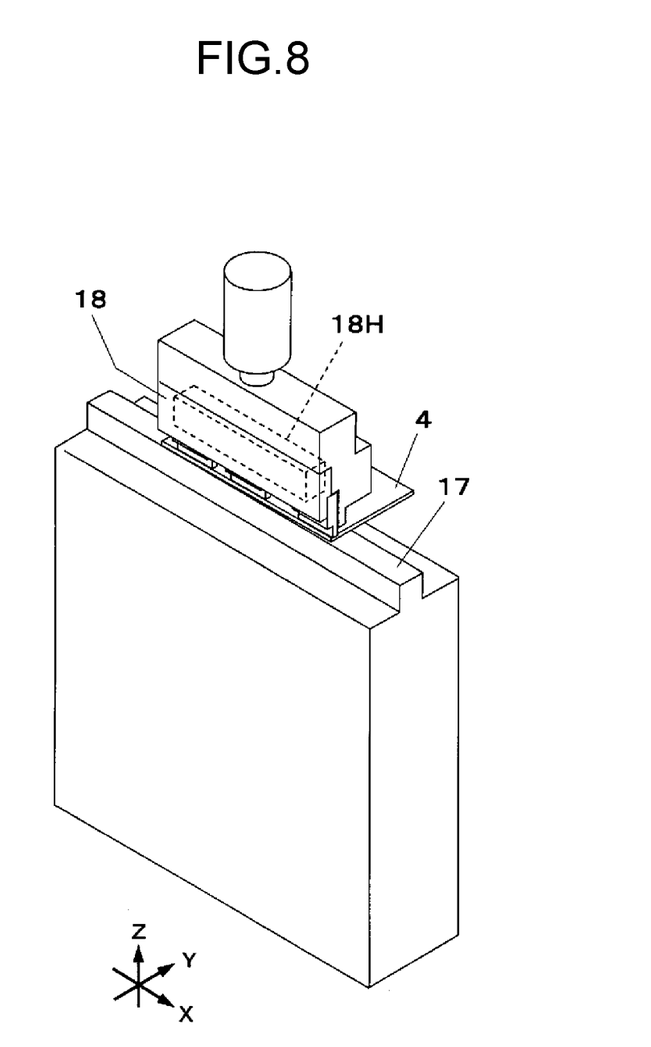
FIG. 8 is a perspective view illustrating a state where a component is elongated by being compressed against a compressing table by a crimping head included in the component crimping device according to the exemplary embodiment of the present disclosure.

Crimping head 18 having sucked component 4 moves upward and then moves forward so that component-side terminal part 4a is located above compressing table 17 (FIG. 7B). Then, crimping head 18 moves downward and compresses component 4 against an upper surface of compressing table 17 from above (FIG. 7C; component compressing step). FIG. 8 illustrates a state where component 4 is elongated by being compressed against compressing table 17 by crimping head 18.

Figure 9A:
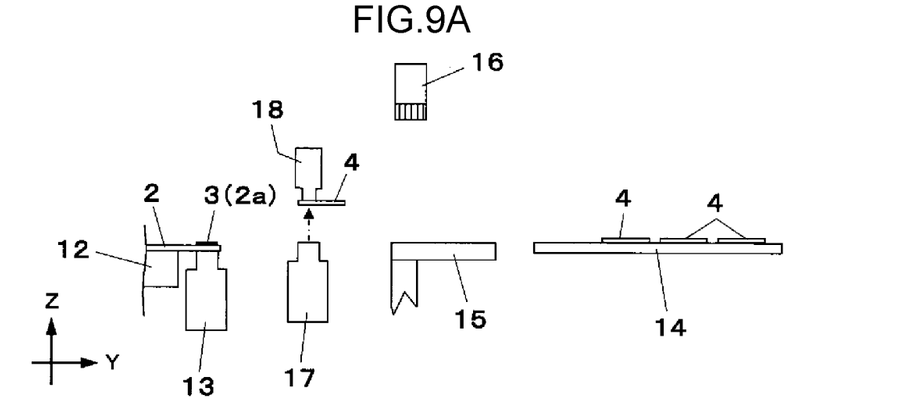
FIG. 9A is a diagram for explaining operation of the component crimping device according to the exemplary embodiment of the present disclosure.
Figure 9B:
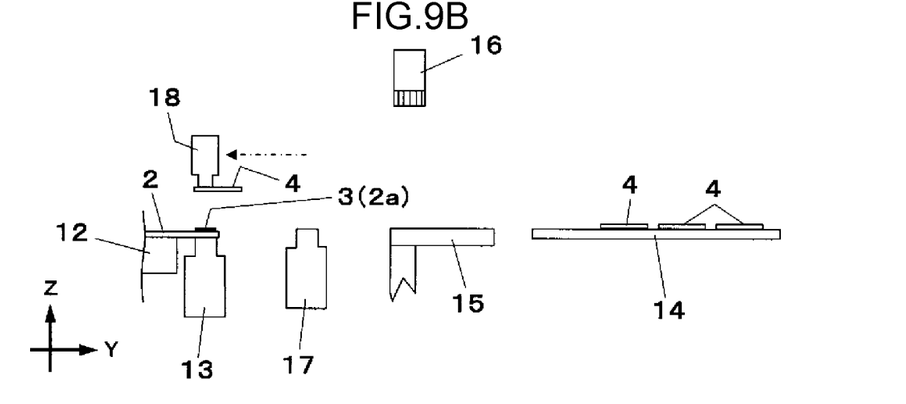
FIG. 9B is a diagram for explaining operation of the component crimping device according to the exemplary embodiment of the present disclosure.
Figure 9C:
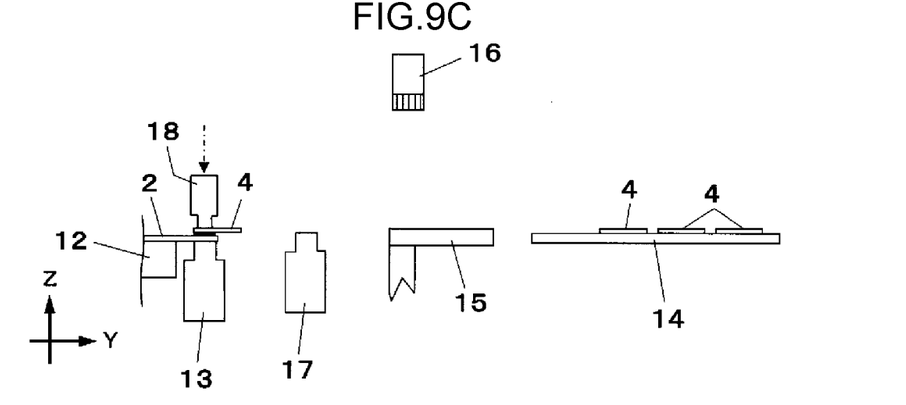
FIG. 9C is a diagram for explaining operation of the component crimping device according to the exemplary embodiment of the present disclosure.

FIGS. 9A through 9C are diagrams for explaining operation of component crimping device 1.

Figure 10:
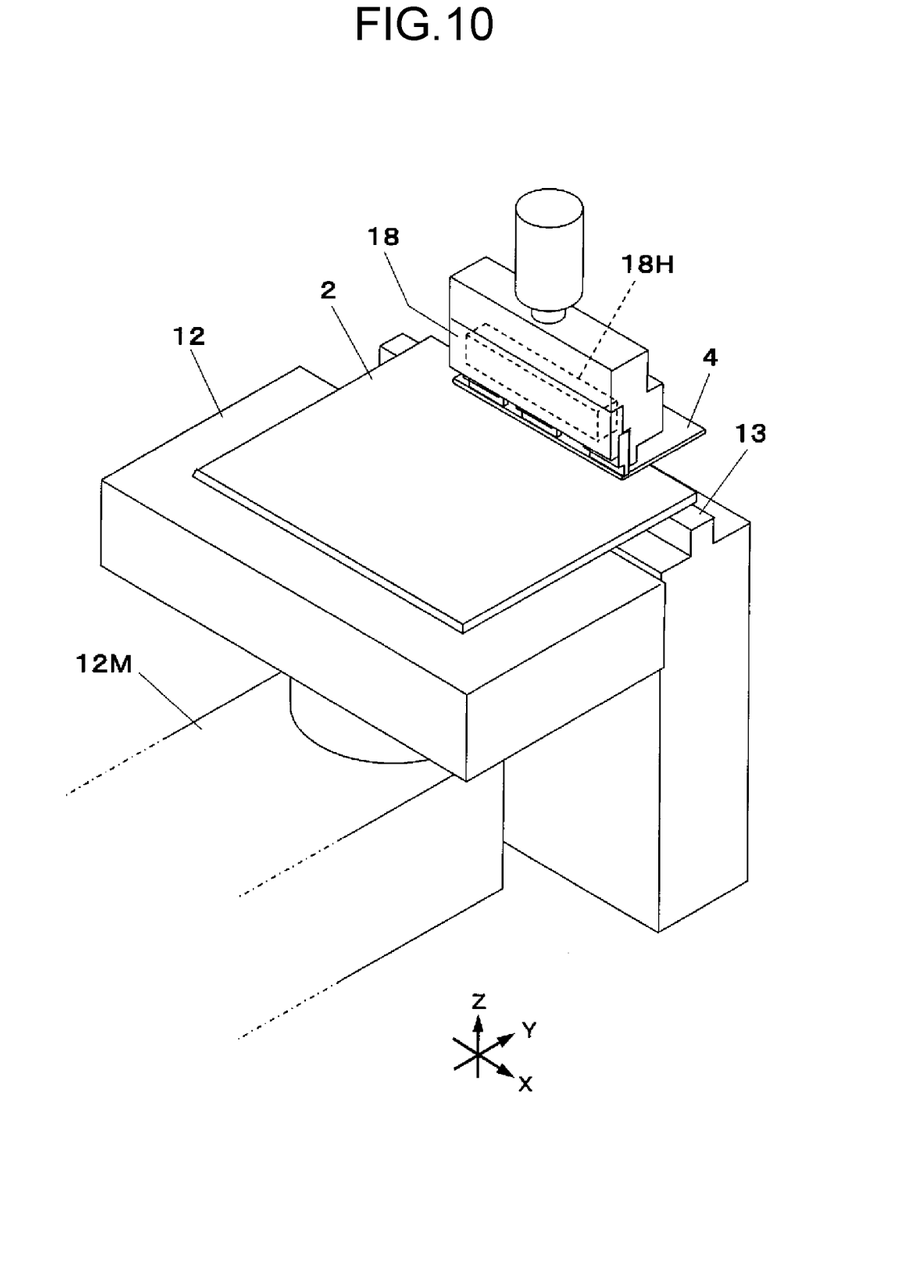
FIG. 10 is a perspective view illustrating a state where the component is pressed against the substrate by the crimping head included in the component crimping device according to the exemplary embodiment of the present disclosure.

Control device 20 turns on timer 20d (FIG. 5) when crimping head 18 starts compressing component 4 against compressing table 17 and thus measures a period for which component 4 is compressed against compressing table 17. When the period measured by timer 20d reaches the compressing period set by compressing period setter 20b and component 4 is sufficiently elongated, crimping head 18 moves upward (FIG. 9A) and then moves forward so that component-side terminal part 4a is located above substrate-side terminal part 2a (FIG. 9B). Then, crimping head 18 moves downward and presses picked-up component 4 against substrate-side terminal part 2a (thermosetting resin tape 3) (FIG. 9C; pressing step). In this step, crimping head 18 presses component 4 against substrate-side terminal part 2a by pressing force set by pressing force setter 20c. FIG. 10 illustrates a state where crimping head 18 presses component 4 against substrate-side terminal part 2a that is supported by support 13 from a lower surface side of substrate-side terminal part 2a.

As described above, in the present exemplary embodiment, operation controller 20a of control device 20 serves as a control unit that controls operation of crimping head 18 such that crimping head 18 picks up component 4, compresses component 4 against compressing table 17 so as to elongate component 4, and then presses component 4 against substrate-side terminal part 2a. Operation controller 20a of control device 20 that serves as a control unit controls operation of crimping head 18 such that crimping head 18 compresses component 4 against compressing table 17 continuously for the compressing period set by compressing period setter 20b. Furthermore, operation controller 20a of control device 20 that serves as a control unit controls operation of crimping head 18 such that crimping head 18 presses component 4 against substrate 2 by the pressing force set by pressing force setter 20c.

After continuously pressing component 4 against substrate 2 for a predetermined pressing continuation period, crimping head 18 releases suction of component 4 and moves upward. This finishes the operation of crimping single component 4 onto substrate 2. After crimping of component 4 onto substrate 2 is finished, substrate holding table moving mechanism 12M moves substrate holding table 12 so that substrate 2 is carried out of component crimping device 1.

As described above, according to component crimping device 1 (component crimping method) according to the present exemplary embodiment, the lower surface side of substrate-side terminal part 2a of substrate 2 held by substrate holding table 12 is supported by support 13, and crimping head 18 picks up component 4 placed on placing table 15 while heating component 4, compresses component 4 against compressing table 17 that serves as a component compressor, and then presses component 4 against substrate-side terminal part 2a. This makes it possible to sufficiently elongate component 4 before component 4 is pressed against substrate 2, thereby preventing component 4 from being excessively elongated due to rapid thermal expansion when component 4 is pressed against substrate 2. It is therefore possible to improve accuracy of attaching component 4 onto substrate 2.

The exemplary embodiment of the present disclosure has been described above, but the present disclosure is not limited to the one illustrated in the exemplary embodiment. For example, in the above exemplary embodiment, camera 16 detects the size of component 4 by capturing images of two component marks 4m provided on component 4. However, the size of component 4 may be detected by other methods. The size of component 4 may be detected by, for example, engraving a mark corresponding to the size of component 4 on component 4 and, for example, reading the mark by using a camera that is separately provided. In the above exemplary embodiment, compressing table 17 is fixedly provided between placing table 15 and support 13 that are provided on base 11. However, the present disclosure is not necessarily limited to this. It is only necessary that compressing table 17 be provided within a range in which crimping head 18 is movable.

In the above exemplary embodiment, placing table 15 is a component placing part on which component 4 to be crimped onto substrate-side terminal part 2a is placed. However, in a case where placing table 15 on which component crimping device 1 temporarily places (provisionally places) component 4 is not provided, component supply table 14 may serve as a component placing part.

In the above exemplary embodiment, pressing force by which crimping head 18 presses picked-up component 4 against substrate-side terminal part 2a may be adjusted by adjusting a distance over which crimping head 18 is moved downward toward support 13 fixed on base 11 or may be adjusted by adjusting a distance over which support 13 configured to be movable up and down relative to base 11 is moved upward toward crimping head 18 (i.e., component 4) located above support 13.

The present disclosure provides a component crimping device and a component crimping method that make it possible to improve accuracy of attaching a component onto a substrate by preventing the component from being excessively elongated due to rapid thermal expansion when the component is pressed against the substrate.

What is claimed is:
1. A component crimping device comprising:
   a substrate holding table that holds a substrate;
   a support that supports a lower surface side of a terminal part of the substrate held by the substrate holding table;
   a component placing part on which a component to be crimped onto the terminal part is placed;
   a crimping head that picks up the component placed on the component placing part while heating the component;
   a component compressing part against which the component is compressed, the component compressing part being separate from the substrate holding table and the support; and
   a controller that controls operation of the crimping head such that the crimping head picks up the component placed on the component placing part, heats the picked up component, compresses the heated component against the component compressing part so as to elongate the heated component, and then presses the elongated component against the terminal part supported by the support.

2. The component crimping device according to claim 1, further comprising a compressing period setter that sets, in accordance with a size of the component, a compressing period for which a state where the component is compressed against the component compressing part continues,
   wherein the controller controls the operation of the crimping head such that the crimping head compresses the component against the component compressing part continuously for the compressing period set by the compressing period setter.

3. The component crimping device according to claim 1, further comprising a pressing force setter that sets, in accordance with a size of the component, pressing force by which the crimping head presses the component against the substrate,
   wherein the controller controls the operation of the crimping head such that the crimping head presses the component against the substrate by the pressing force set by the pressing force setter.

4. The component crimping device according to claim 1, wherein the component compressing part is provided between the component placing part and the support.

5. The component crimping device according to claim 1, wherein the component includes a film-shaped component.

6. A component crimping method comprising:
   holding a substrate by a substrate holding table;

supporting, by a support, a lower surface side of a terminal part of the substrate held by the substrate holding table;

picking up, by a crimping head, a component placed on a component placing part while heating the component;

compressing, by the crimping head, the component thus picked up and heated against a component compressing part so as to elongate the component, the component compressing part being separate from the substrate holding table and the support; and pressing, by the crimping head, against the terminal part supported by the support, the component thus elongated by being compressed against the component compressing part.

7. The component crimping method according to claim 6, further comprising setting, in accordance with a size of the component, a compressing period for which a state where the component is compressed against the component compressing part continues, wherein in the step of compressing, the component is compressed against the component compressing part continuously for the compressing period set in the step of setting.

8. The component crimping method according to claim 6, further comprising setting, in accordance with a size of the component, pressing force by which the component is pressed against the substrate, wherein in the step of pressing, the crimping head presses the component against the substrate by the pressing force set in the step of setting.

9. The component crimping method according to claim 6, wherein the component compressing part is provided between the component placing part and the support.

10. The component crimping method according to claim 6, wherein the component includes a film-shaped component.

* * * * *